(12) United States Patent
Gardner

(10) Patent No.: US 6,414,360 B1
(45) Date of Patent: *Jul. 2, 2002

(54) METHOD OF PROGRAMMABILITY AND AN ARCHITECTURE FOR COLD SPARING OF CMOS ARRAYS

(75) Inventor: Harry N. Gardner, Colorado Springs, CO (US)

(73) Assignee: Aeroflex UTMC Microelectronic Systems, Inc., Colorado Springs, CO (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,344

(22) Filed: Jun. 9, 1998

(51) Int. Cl.[7] .................... H01L 27/092; H03K 19/185; H03K 19/948

(52) U.S. Cl. .............................. 257/369; 326/58; 326/81

(58) Field of Search ........................... 257/369; 326/58, 326/81

(56) References Cited

U.S. PATENT DOCUMENTS

| | | | |
|---|---|---|---|
| 5,041,894 A | 8/1991 | Reczek et al. ............... 257/372 |
| 5,117,129 A | 5/1992 | Hoffman et al. | |
| 5,124,778 A | * 6/1992 | Aoaci ........................ 257/369 |
| 5,387,826 A | 2/1995 | Shay et al. | |
| 5,404,329 A | 4/1995 | Yamagata et al. ..... 365/189.09 |
| 5,444,397 A | 8/1995 | Wong et al. | |
| 5,450,025 A | 9/1995 | Shay | |
| 5,539,335 A | * 7/1996 | Kobayashi et al. ........... 326/81 |
| 5,543,734 A | 8/1996 | Volk et al. | |
| 5,555,149 A | 9/1996 | Wert et al. | |
| 5,565,794 A | 10/1996 | Porter et al. | |
| 5,568,065 A | 10/1996 | Wert et al. | |
| 5,629,634 A | 5/1997 | Carl et al. | |
| 5,631,579 A | 5/1997 | Miki et al. | |
| 5,686,752 A | * 11/1997 | Ishimura et al. ............. 257/369 |
| 5,828,108 A | * 10/1998 | Toyoda ........................ 257/372 |
| 5,867,039 A | * 2/1999 | Golke .......................... 326/81 |

FOREIGN PATENT DOCUMENTS

EP 0 3 82 865 A1 8/1990

OTHER PUBLICATIONS

Patent Abstracts of Japan Publication No. 60083362, published May 11, 1985.
Le phénomène de "Latch–up" dans les convertisseurs CMOS, Comment s'en "préserver", Electronique Radio Plans (1990) Sep., No. 514, Paris, France, pp. 37–42.
New Latchup Failure Mechanism Induced By An Elevated Via Resistance On Multilayer CmoS Technology, published Apr. 4, 1995, pp. 249–253.

* cited by examiner

Primary Examiner—Gene M. Munson
(74) Attorney, Agent, or Firm—Morgan & Finnegan, LLP

(57) ABSTRACT

A P-channel transistor is disclosed having P+ source and drain regions formed in a N– well, which is formed in a P– substrate. A third P+ region is provided that functions as a well tie. When the P-channel transistor is used as the pull-up transistor in a CMOS "push-pull" output buffer circuit, the P+ well tie prevents undesired current flow from the bus back to the positive voltage supply. This prevents potential damage to the power supply plane and any additional components connected thereto. In another aspect, the N– well has formed therein both a P+ and N+ well tie. Additional switch circuitry is provided which allows for upper level programmability or selection of either one or both of the two well ties, depending upon the ultimate circuit configuration.

6 Claims, 4 Drawing Sheets

METHOD OF PROGRAMMABILITY AND AN ARCHITECTURE FOR COLD SPARING OF CMOS ARRAYS

TECHNICAL FIELD

This invention relates to integrated circuits ("ICs"), and more particularly to the internal structure of a P-channel, metal oxide semiconductor field effect transistor ("MOSFET") that prevents undesired current flow through the transistor when the transistor forms part of an output buffer circuit connected to a bus.

BACKGROUND ART

Input/Output ("I/O") buffer circuits are in widespread usage in various applications. These buffers typically interface digital logic circuits with a common bus. The bus generally comprises a plurality of signal lines, e.g., data and address, connected to various circuit modules within a device such as a computer. In the alternative, the bus represents the external physical signal wires connected between the individual devices themselves (e.g., computer, printer, video screen, keyboard).

Referring to FIG. 1, a typical CMOS transistor buffer output circuit 100 generally comprises a P-channel MOSFET 104 and an N-channel MOSFET 108 connected in series between a positive voltage supply, Vdd, usually +3.0/+3.3 volts or +5.0 volts, and a negative voltage supply, Vss, generally at ground or zero volts. As such, the buffer 100 of FIG. 1 comprises the well-known, "push-pull", "full rail swing", CMOS output buffer circuit.

The gate terminal (G1, G2) of each transistor 104, 108 is connected to the digital and/or analog circuitry 112 that forms the remainder of the module circuitry. This module circuitry 112 can take on many different, known configurations, depending upon the application. The module circuitry 112 controls the switching of each transistor 104, 108 between its "on" and "off" states. The drain terminals of the two transistors 104, 108 are connected together and to an I/O pad 116, which represents one signal line on a bus.

Typically, the module circuitry 112 controls the switching voltage applied to the gate terminals of the two output buffer transistors 104, 108 such that three different voltage conditions may exist on the I/O pad 116. One condition is where the P-channel transistor 104 is on and the N-channel transistor 108 is off, which switches the value of Vdd onto the bus. A second condition is where the N-channel transistor 108 is on and the P-channel transistor 104 is off, which switches the value of Vss, or zero volts, onto the bus. A third condition is a high impedance state where both transistors are off. In this state, the output buffer circuit 100 essentially disconnects the module circuitry 112 from the bus, and allows another module and its corresponding output buffer (not shown) to drive the bus. Generally, only one module can drive the bus at any one time. Otherwise, bus contentions could occur, possibly causing physical damage to circuit components connected to the bus.

Besides connecting the module circuitry 112 to the bus, the CMOS push-pull output buffer 100 of FIG. 1 performs other functions. One is to protect the electronic components of the module circuitry 112 from electrostatic discharge ("ESD"). Static electric charge can build up on a person. When the person handles the electronic equipment, the built-up static charge can be transmitted as electrical current to the module circuitry 112. The charge can be potentially damaging to the electronic components of the module circuitry and to the power supply planes within the circuitry.

One common way of preventing the potentially damaging effects of electrostatic discharge is to provide protection against such discharge in the output buffer 100. Typically, this is done by scaling the N-channel and P-channel pull-up transistors 108, 104 to be of a relatively large size to reduce the resistance path encountered by the static charge between the I/O pad 116 and the Vss and Vdd power supply planes.

The geometries of IC devices continue to decrease in an effort to increase the number of devices (e.g., transistors, resistors, capacitors) integrated onto an IC substrate. Device sizes are now well within the sub-micron dimension range. Increases in integration have been achieved largely through advances in IC manufacturing techniques, such as photolithography.

With respect to CMOS transistors, the shrinking of device sizes has resulted in a lowering of the supply voltages used with these devices. For example, it has been known to predominantly use +5 V and ground as the power supply voltages within CMOS circuits. However, with increasingly smaller transistor sizes, the use of +5 volts presents problems in transistor operation. These problems include the hot electron carrier effect, which can degrade device performance. All of these problems result from the fact that an increasingly smaller physical device size must support the relatively high electric field provided for by the +5 volt power supply.

It is now common to use +3.0 V or +3.3 V as the value of the positive voltage supply for CMOS transistors. Use of this lower voltage alleviates the aforementioned problems with device operation caused by the +5 V power supply. It also results in significantly lower power dissipation per transistor, which is an important factor affecting such parameters as the overall operating speed of the IC.

However, the increasing prevalence of CMOS transistor circuits powered by the lower supply voltage of +3.0 V/+3.3 V has caused a problem when a plurality of modules or individual devices are connected together by a bus. Specifically, the problem occurs when an output buffer (such as the buffer 100 of FIG. 1) has its P-channel pull-up transistor connected to a Vdd of +3.0 V/+3.3 V, while another module driving the bus has placed a signal at +5 V onto the bus. This +5 V bus signal may originate from a module with internal CMOS circuitry operating at +5 V. When using the conventional CMOS push-pull circuit 100 of FIG. 1, the +5 V signal on the I/O pad 116 causes an undesired current to flow from the bus through the P-channel transistor 104 to Vdd. This current flow into the Vdd power supply plane can cause various problems, including damage to the module circuitry components connected to the plane and problems with the binary logic voltage levels on the bus. These components are "back-powered" by the undesired current flow.

This undesired current can flow from the bus through the P-channel pull-up transistor 104 and into the Vdd power supply plane any time the voltage on the bus is greater than the voltage value of Vdd. As described above, one common example of this is when the voltage used by one module's output buffer is lower than the voltage used by another module's output buffer. Another common example occurs when it is desired to turn off all power to a module connected to the bus. The turned-off module is referred to as being "cold spared". The module is "cold" and operating as a "spare" since no power is applied. Often in fault tolerant systems, it is desired to cold spare unused circuits to reduce overall power consumption. The cold spare circuit must present a high impedance to the bus, to avoid any undesired current flowing from the bus into the Vdd power supply plane.

With respect to FIG. 1, when Vdd is equal to zero volts, the module circuitry 112 and associated output buffer 100 are cold. It is then desired to prevent any positive voltage values on the bus from providing a current through the P-channel transistor 104 to the Vdd power supply plane.

However, the output buffer circuit 100 is problematic in that the P-channel pull-up transistor 104 cannot prevent such current from flowing from the bus into the Vdd power supply plane. To see how this undesired current can flow, reference is made to FIG. 2. FIG. 2 is a cross-sectional illustration of the P-channel transistor 104 and N-channel transistor 108 of FIG. 1 formed in a P– silicon substrate 120. An N– well 124 is formed in the substrate 120. The drain and source of the P-channel transistor 104 are formed in the N– well 124. Both the drain 128 and source 132 of the P-channel transistor 104 comprise P– doped regions in the well 124. Also, a region 136 doped N+ is provided that functions as the well tap which connects to Vdd to charge up the well 124 during normal transistor operation. Similarly, the N-channel transistor 108 is formed directly in the P– substrate 120 by formation of a source 140 and a drain 144, both doped N+, together with a P+ well tie 148.

When a positive voltage is applied to the I/O pad 116 and when Vdd equals zero volts, current flows from the I/O pad 116 into the N– well 124 through the P+ drain 128. The P+ drain 128 and N– well 124 form a forward biased P/N junction diode. The current travels through the well 124 and to Vdd via the N+ well tap 136.

Another mechanism for undesired current flow through the P-channel transistor 104 occurs when the voltage on the gate terminal of the transistor is somewhat lower than the voltage on the I/O pad 116. As a result of this voltage differential, the P-channel transistor 104 will turn on and conduct current through the channel region 152. The channel 152 is that region of the N– well 124 located vertically underneath the oxide insulator separating the gate terminal from the substrate 120 and located laterally between the drain 128 and source 132. In this case, normal transistor operation is inverted in that now the drain 128 is acting as a source and the source 132 is acting as a drain.

The prior art has recognized the problem with undesired current flow through the P-channel transistor 104 functioning as the pull-up transistor in the CMOS output buffer circuit 100 of FIG. 1. The prior art contains a number of various schemes for preventing this undesired current flow. See, for example, U.S. Pat. Nos. 5,543,734, 5,387,826, 5,631,579, 5,444,397, 5,555,149, 5,565,794, 5,568,065, 5,629,634, 5,450,025 and 5,117,129. However, all of these patent references describe schemes that involve the use of additional, complex circuitry. This circuitry takes up valuable space on an IC substrate and requires additional IC processing steps. What is desired is a simpler, less complex method of preventing undesired current flow through the P-channel transistor that forms part of the CMOS output buffer circuit.

DISCLOSURE OF INVENTION

Objects of certain embodiments of the invention include the prevention of an undesired current flow from an external bus connected to an output buffer circuit containing a P-channel transistor and through that transistor to the positive voltage supply. Other objects include the prevention of this undesired current flow to the power supply plane of additional circuitry connected to the output buffer, thereby preventing back-powering of electronic components within the circuitry and also preventing any damage to such circuitry. Further objects include the prevention of the undesired current flow through the P-channel transistor in an output buffer circuit, thereby preventing problems with logic levels on the bus, such as degradation of the bus signals, bus latch-up or bus contention.

According to one aspect of the present invention, an output buffer circuit comprises a P-channel transistor and an N-channel transistor connected in series in a push-pull configuration. The N-channel transistor is formed in a P– substrate, while the P-channel transistor is formed in an N– well formed in the P– substrate. The N+ source of the N-channel transistor is connected to ground. The N+ drain of the N-channel transistor is connected to the P+ drain of the P-channel transistor and to the external bus. The P+ source of the P-channel transistor is connected to Vdd. Vdd is also connected to the N– well through a P+ well tie.

In operation, with Vdd equal to zero volts and a positive voltage on the bus (or anytime the bus voltage is greater than Vdd), current flows into the N– well through the forward biased junction diode comprising the P+ drain and the N– well. However, the current cannot continue into the power supply plane, since it is prevented from doing so by the two reverse biased PN junction diodes within the P-channel transistor, comprising the P+ source and N– well and the P+ well tie and N– well.

According to another aspect of the present invention, the P-channel transistor is formed in the N– well. That transistor has two separate well ties: the N+ well tie of the prior art and the P+ well tie of the first aspect of the present invention. Switch circuitry, external to the P-channel transistor, is provided to allow for the programmable connection of either one or both of the well ties to additional circuitry, depending upon the circuit configuration in which the P-channel transistor is utilized. This aspect of the present invention contemplates usage of the P-channel transistor and switch circuitry in a CMOS gate array.

The above and other objects and advantages of this invention will become readily apparent when the following description is read in conjunction with the accompanying drawings.

BEST MODE FOR CARRYING OUT THE INVENTION

A first aspect of the present invention relates to the internal structure of a P-channel MOSFET transistor utilized in a push-pull, output buffer circuit configuration. According to a preferred, exemplary embodiment of this first aspect, the P-channel transistor is formed in an N− well. The N− well is formed in a P− substrate comprised of semiconductor material, such as silicon. Instead of utilizing an N+ well tie connected to the positive voltage supply as is known in the prior art, the first aspect of the present invention utilizes a P+ well tie. A reverse biased junction diode is formed between the P+ well tie and the N− well. This reverse biased diode prevents any current from flowing back into the Vdd power supply plane when the N− well is at a higher voltage value than that of the P+ well tie.

According to a second aspect of the present invention, the P-channel transistor is provided with two separate well ties. A first well tie is the P+ well tie according to the first aspect of the present invention. The second well tie is an N+ well tie that is known in the prior art and described above. Additional switch circuitry is provided, external to the P-channel transistor, to allow for upper level programmability in selecting one or both of the well ties, depending upon the ultimate circuit application of the transistor. This second aspect of the present invention contemplates usage of the P-channel transistor in a CMOS gate array.

Figure 1:
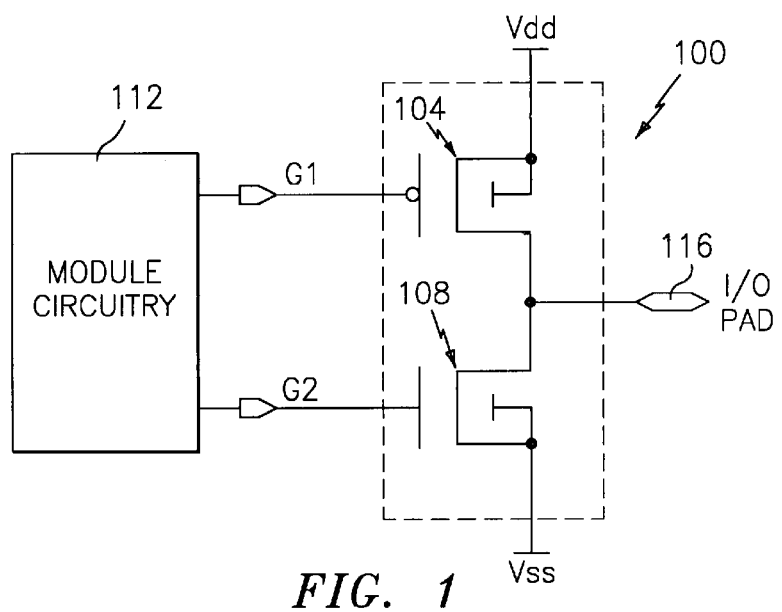
FIG. 1 is a schematic illustration of a prior art, two transistor output buffer circuit together with associated module circuitry.
Figure 2:
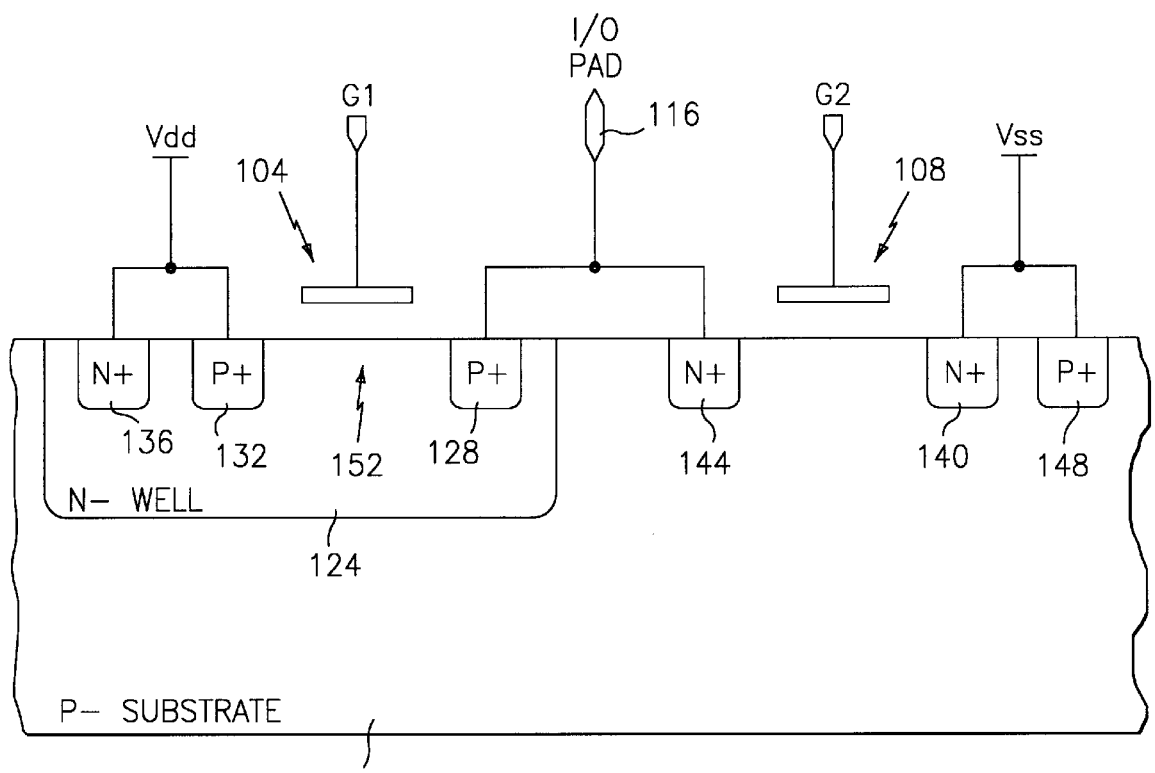
FIG. 2 is a cross-sectional illustration of a semiconductor substrate of the prior art illustrating the formation of the two transistors of the output buffer circuit of FIG. 1.
Figure 3:
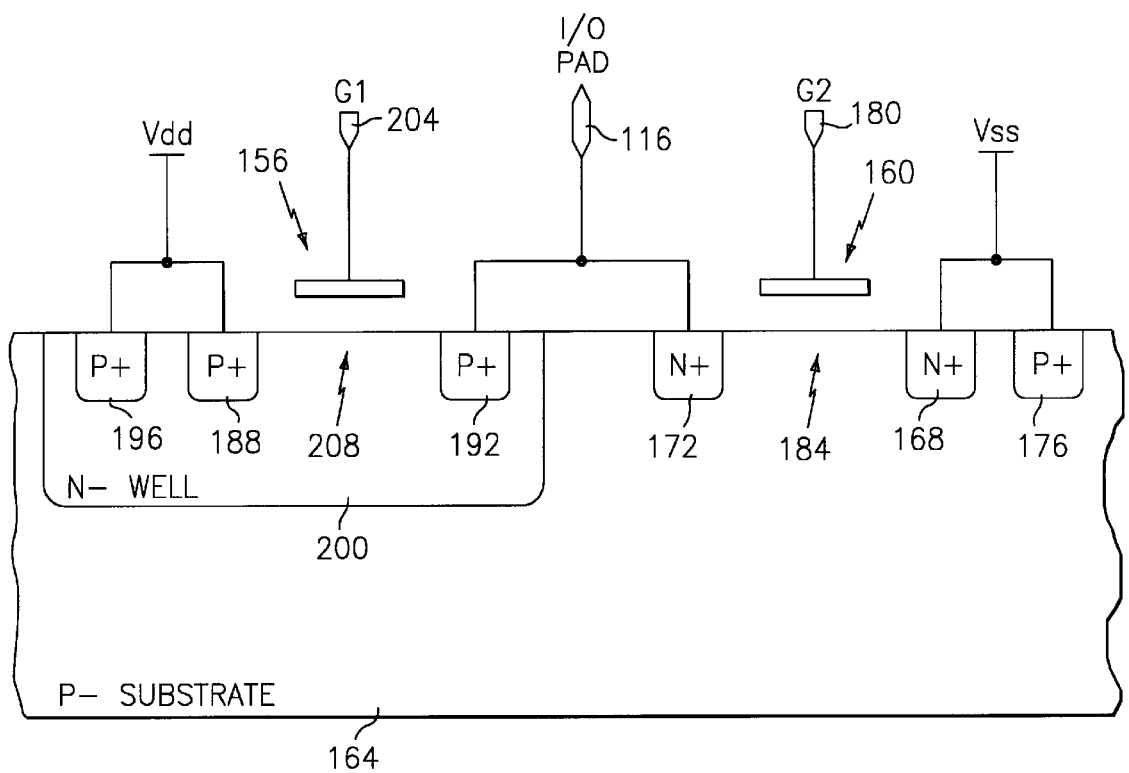
FIG. 3 is a cross-sectional illustration of a semiconductor substrate showing two transistors of the present invention connected in an output buffer circuit arrangement.

Referring to FIG. 3, there illustrated is a P-channel transistor 156 and an N-channel transistor 160 formed in a P− silicon substrate 164. The arrangement of the two transistors 156, 160 are somewhat similar to the two transistors 104, 108 of FIGS. 1 and 2, described above. The transistors 156, 160 are connected in a push-pull output buffer configuration. The N-channel transistor 160 has a source 168 and a drain 172, both doped N+. The N-channel transistor 160 also includes a P+ region 176 that functions as the well tap. Both the source 168 and well tap 176 of the N-channel transistor 160 are connected to Vss, or zero volts. The N+ drain 172 is connected to the I/O pad 116. A gate terminal, G2 180, is also provided. A channel region 184 is formed in the P− substrate 164 vertically underneath an oxide insulating region separating the gate terminal 180 from the substrate 164 and laterally between the source 168 and drain 172.

The P-channel transistor 156 has three separate P+ regions, all of which are formed in an N− well 200, which itself is formed in the P− substrate 164. Two of the P+ regions comprise the source 188 and drain 192 of the P-channel transistor 156. A gate terminal, G1 204, overlies an oxide insulator which itself overlies a portion of the N− well 200. That portion of the N− well 200 defines a channel region 208 between the source 188 and drain 192. The P+ drain 192 of the P-channel transistor 156 is connected to the I/O pad 116. The P+ source region 188 is connected to the positive voltage supply, Vdd.

According to the first aspect of the present invention, a third P+ region 196 is provided in the N− well 200 in which the P-channel transistor 156 is formed. This P+ region 196 forms a P/N junction diode with the N− well 200. Also, this P+ region 196 is connected to the positive voltage supply, Vdd. As compared to the structure of this P-channel transistor 104 illustrated in FIG. 2, the P-channel transistor 156 of FIG. 3 prevents current from flowing back to the positive voltage supply, Vdd, whenever the value of the voltage on the I/O pad 116 is greater than the voltage value of Vdd. Specifically, when the voltage value on the I/O pad 116 is greater than Vdd, current flows into the N− well 200 through the P+ drain 192. The P+ drain 192 and the N− well 200 form a forward biased P/N junction diode. However, this current cannot continue to flow into the positive voltage supply, Vdd, since it is prevented from doing so by the two reverse biased P/N junction diodes. One diode is formed by the P+ well tie 196 and N− well 200, while the other diode is formed by the source 188 and N− well 200.

One common instance where the voltage on the I/O pad 116 is greater than the voltage value of the positive voltage supply, Vdd, is when another module has placed a signal having a voltage value of +5 V onto the bus, while the module containing the P-channel transistor 156 of FIG. 3 is operating with a value of +3.0 V/+3.3 V for Vdd. As described above, this situation is becoming more commonplace, due to the increasing prevalence of +3.0 V/+3.3 V for the positive voltage supply utilized with CMOS transistors. Another instance when the value of the voltage on the I/O pad 116 is greater than Vdd is when the module circuitry containing the P-channel transistor 156 of FIG. 3 is cold spared. In this instance, the P-channel transistor 156 prevents current from flowing from the bus back to the Vdd power supply plane.

Although not shown, an alternative to the configuration of the P-channel transistor 156 and the N-channel transistor 160 shown in FIG. 3 has the P+ well tap 176 of the N-channel transistor 160 located to the left of the N+ drain 172 and to the right of the N− well 200. The P+ well tap 176 is still connected to Vss. Another P+ well tap (not shown), also connected to Vss, may then be located in the P− substrate 164 to the left of the N− well 200. These two P+ well taps form a guard ring through the lateral NPN transistor structure. The guard ring, which completely surrounds the N− well 200, suppresses or degrades the gain of the lateral SCR transistor inherently formed by the transistor structure of FIG. 3. An additional N well (not shown) with an N+ ohmic contact could be used to provide an additional guard ring around the N well, if so desired, at smaller dimensions for increased robustness.

Figure 4:
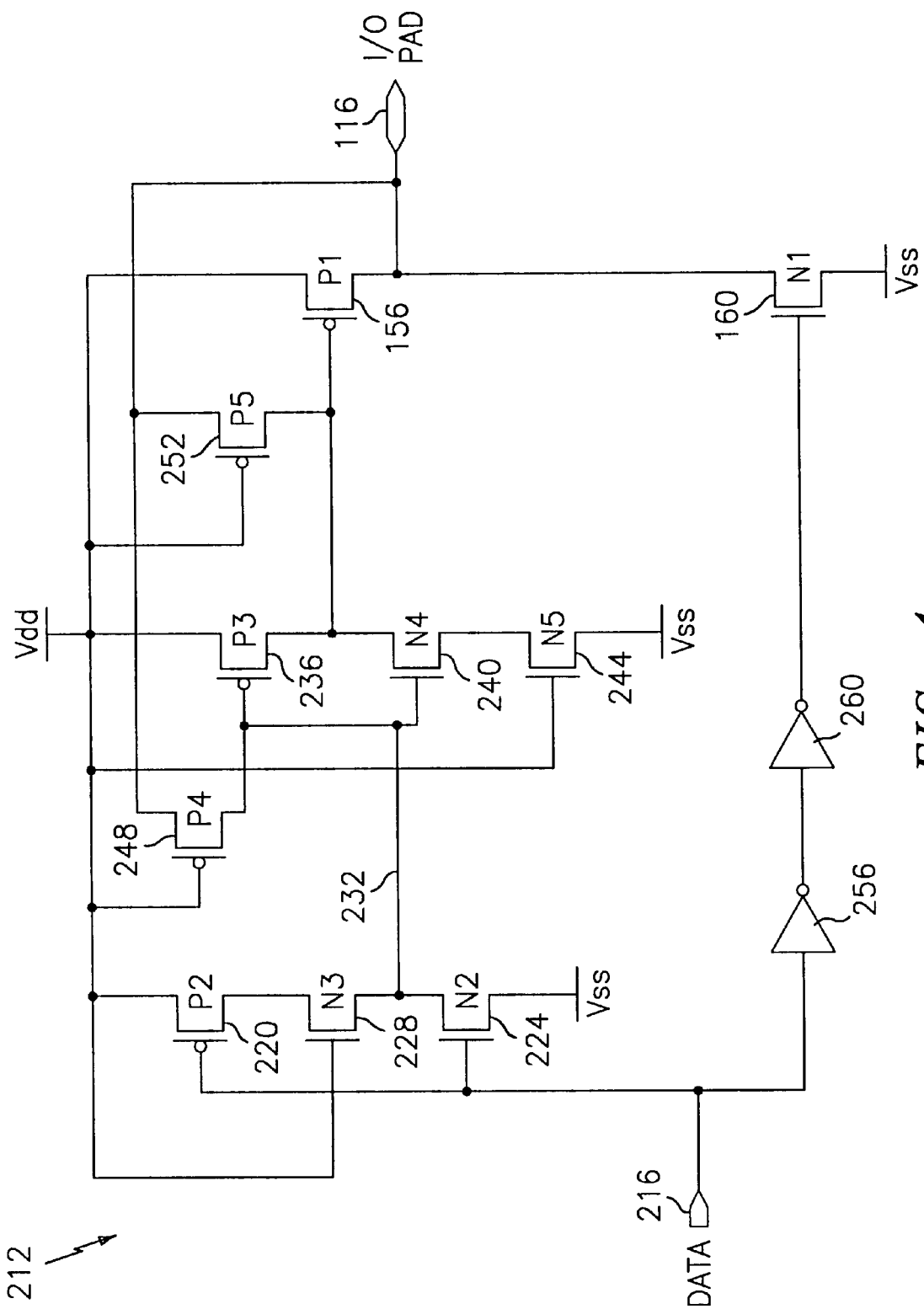
FIG. 4 is a schematic illustration of the two transistors of FIG. 3 connected as the output buffer circuit of FIG. 3, together with additional circuit components.

Referring to FIG. 4, there illustrated is the P-channel transistor, P1 156, and the N-channel transistor, N1 160, of FIG. 3, connected in a push-pull, full rail swing, CMOS transistor circuit configuration that is part of an output buffer circuit 212. The buffer 212 has, as an input, the DATA signal line 216 provided by other circuitry (not shown). Typically the DATA signal 216 is a binary logic signal that can either be a logic HIGH or a logic LOW. The buffer 212 takes this DATA signal 216 and provides its inverted binary logic equivalent on the I/O pad 116, which is a signal line that forms a portion of a plurality of signal lines comprising a bus. The bus is typically connected to other circuit modules (not shown).

The output buffer 212 utilizes a positive voltage supply, Vdd, and a second voltage supply, Vss, which is typically zero volts or electrical ground. The value of the positive voltage supply, Vdd, can be any positive voltage value, typically, +3.0 V, +3.3 V or +5.0 V. The buffer 212 is operable to provide a signal only at either a logic HIGH voltage level (i.e., Vdd) or a logic LOW voltage level (i.e., Vss) on the I/O pad 116. The buffer 212 does not provide a signal with a third, high impedance state on the I/O pad 116.

The DATA input signal 216 is connected to the gate terminals of both a P-channel transistor, P2 220, and an N-channel transistor, N2 224. These two transistors 220, 224 are connected as an inverter. Connected between these two transistors 220, 224 is an N-channel transistor, N3 228. The gate terminal of this transistor 228 is connected to Vdd. When the output buffer 212 is in normal operation (i.e., with Vdd at its positive voltage value), transistor N3 228 is on. This enables either transistor P2 220 or transistor N2 224 (depending upon which transistor 220, 224 has been turned on) to switch either Vdd or Vss onto a signal line 232 connected to the gate terminals of both a P-channel transistor, P3 236, and an N-channel transistor, N4 240. These two transistors, P3 236 and N4 240, are connected as an inverter. Another N-channel transistor, N5 244, has its gate terminal connected to Vdd. In normal buffer operation, transistor N5 224 is turned on.

Two separate P-channel transistors, P4 248 and P5 252, are provided. The gate terminals of these two transistors 248, 252 are connected to Vdd. During normal buffer operation, these two transistors 248, 252 are turned off. The drains of transistors P3 236 and N4 240 are connected together and to the gate terminal of the P-channel, pull-up transistor, P1 156.

The DATA input line 216 is also connected to the input of a first inverter 256, whose output is connected to the input of a second inverter 260. The output of this second inverter 260 is connected to the gate terminal of the N-channel, pull-down transistor, N1 160.

During normal operation of the output buffer circuitry 212 of FIG. 4, Vdd is at its positive voltage value of, e.g., +5 V. As such, N-channel transistors N3 228 and N5 244 are turned on, while P-channel transistors P4 248 and P5 252 are turned off. When the DATA input signal 216 is a logic HIGH, N-channel transistor N1 160 is turned on, which switches zero volts onto the I/O pad 116. Also, N-channel transistor N2 224 is turned on while P-channel transistor P2 220 is turned off. Thus, zero volts is applied to the gate terminals of transistors P3 236 and N4 240. As such, transistor P3 236 switches Vdd to the gate terminal of transistor P1 156, which turns this transistor off. The purpose of the two inverters 256, 260 connected in series prior to the gate terminal of transistor N1 160 is to provide a slight time delay to approximately match the switching time delays of the transistors P2 220, N2 224, P3 236, N4 240 and P1 156.

In contrast, when the DATA input signal 216 is a logic LOW, N-channel transistor N1 160 is turned off, while transistors P2 220, N4 240 and P1 156 are all turned on. This switches the Vdd onto the I/O pad 116.

When it is desired to cold spare the output buffer circuit 212 of FIG. 4 (by reducing the value of the positive voltage supply, Vdd, to zero volts), transistors N3 228 and N5 244 are both turned off, while transistors P4 248 and P5 252 are both turned on. By turning transistors N3 228 and N5 244 off during cold sparing, these transistors prevent possible current leakage into other portions of the buffer circuit 212. Also, by turning transistors P4 248 and P5 252 on during cold sparing, these transistors connect zero volts on the I/O pad 116 back to the positive voltage supply, Vdd, which is also at zero volts. Then, if the voltage on the I/O pad starts to increase, the voltage at the output terminals (i.e., the drains) of transistors P4 248 and P5 252 also starts to increase, which further insures that there is no current leakage back through transistor P1 156 and to the positive voltage supply, Vdd.

Figure 5:
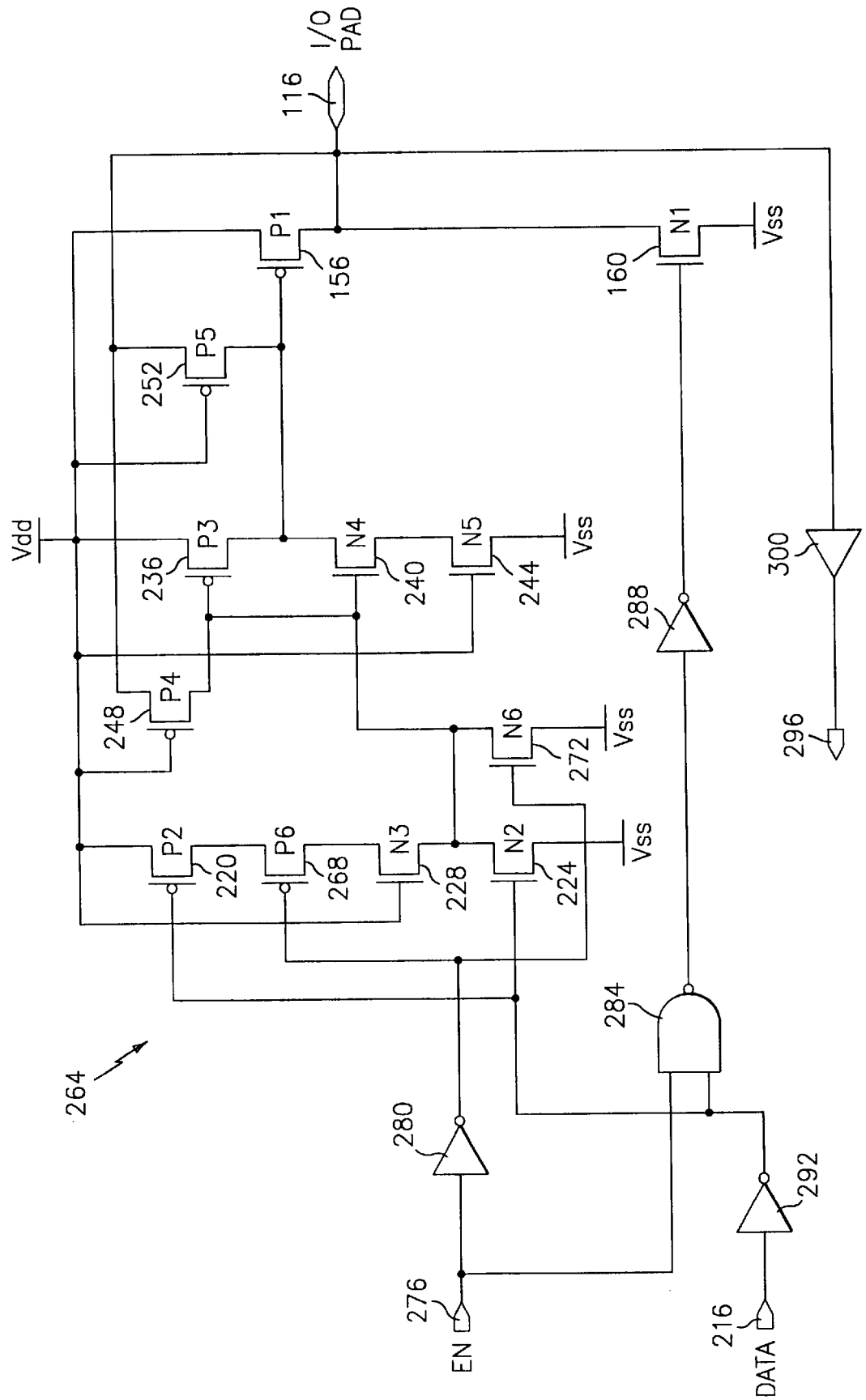
FIG. 5 is a schematic illustration of the two transistors of FIG. 3 in an alternative embodiment of the circuit of FIG. 4.

Referring now to FIG. 5, there illustrated is a schematic diagram of an alternative embodiment of an output buffer circuit 264. The circuit of FIG. 5 contains some additional components which allow the output buffer circuit 264 to provide a third, high impedance state onto the I/O pad 116. The circuit 264 of FIG. 5 also allows for bidirectional operation, in that the signal on the I/O pad 116 can now be fed back into other portions of the module circuitry (not shown) that contain the output buffer circuit 264 of FIG. 5.

The transistor components of FIG. 4 that also appear in FIG. 5 have the same reference numbers and designations. The output buffer circuit 264 of FIG. 5 adds a P-channel transistor, P6 268, and an N-channel transistor, N6 272. The purpose of these two transistors 268, 272 is to allow the circuitry 264 to simultaneously turn off both transistors P1 156 and N1 160, thereby placing a high impedance state onto the I/O pad 116. Transistor N1 160 is forced off through NAND gate 284.

In the other enabled state, when the EN input signal 276 is a logic HIGH, transistor P6 268 is turned on, while transistor N6 272 is turned off. The EN signal 276 is connected to the gate terminals of transistors P6 268 and N6 272 through an inverter 280. The EN input signal 276 is also fed to an input of a NAND gate 284. The output of the NAND gate 284 is fed through an inverter 288 to the gate terminal of the N-channel, pull-down transistor, N1 160. When the DATA input signal 216 is a logic HIGH, the output of the NAND gate 284 is a logic HIGH, which turns off transistor N1 160. The DATA input signal 216 is connected to the gate terminals of transistors P2 220 and N2 224 through an inverter 292. At the same time, transistors P2 220, P6 268 and N3 228 are all turned on, which turns off transistor P3 236 and on transistor P1 156. This switches Vdd onto the I/O pad 116.

In contrast, when the DATA input signal 216 is a logic LOW, the output of the NAND gate 284 is a logic LOW, which turns on transistor N1 160, thereby switching zero volts onto the I/O pad 116. At the same time, transistor N2 224 is turned on, which switches zero volts onto the gate terminal of transistor P3 236. This switches Vdd onto the gate terminal of transistor P1 156, which turns transistor P1 156 off.

For bidirectional operation, typically both transistors P1 156 and N1 160 are turned off, which allows another module circuitry (not shown) to provide a voltage signal on the I/O pad 116. This signal can be fed back into the module circuitry on the signal line 296 and through a buffer amplifier 300.

Figure 6:
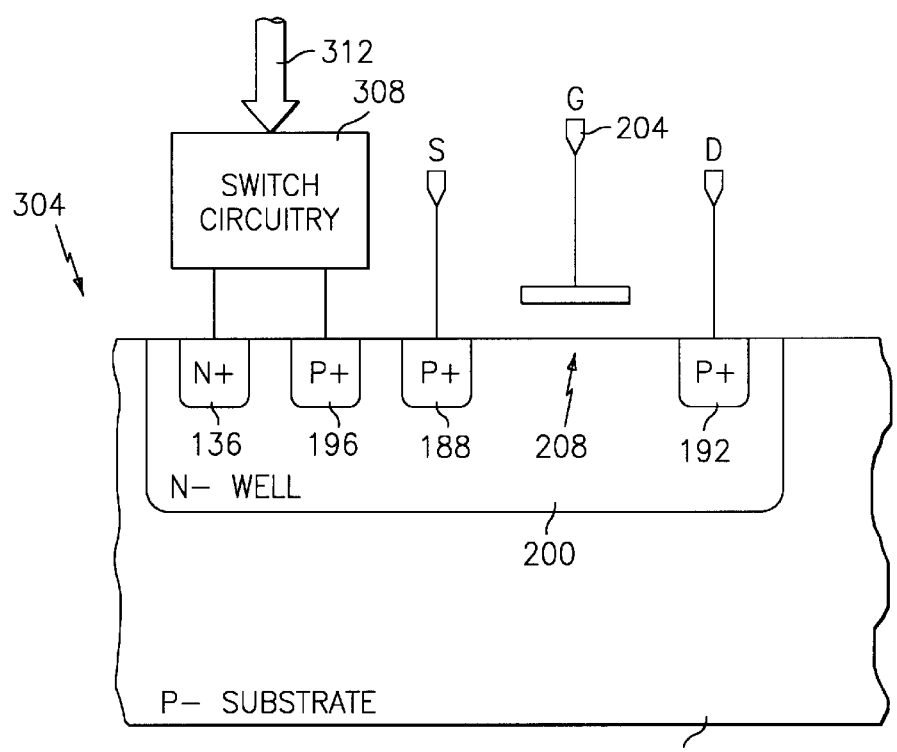
FIG. 6 is a cross-sectional illustration of a semiconductor substrate showing the formation therein of a P-channel transistor with two different well ties, together with associated switch circuitry, according to a second aspect of the present invention.

Referring to FIG. 6, there illustrated is an alternative embodiment of a P-channel transistor 304, which functions as the pull-up transistor in a conventional push-pull, full rail swing, CMOS output buffer circuit, similar to that previously described and illustrated. When comparing the structure of the P-channel transistor 304 of FIG. 6 with the P-channel transistors 104, 156 of FIGS. 2 and 3, it can be seen that the P-channel transistor 304 of FIG. 6 contains both the P+ well tie 196 of FIG. 3 and the N+ well tie 136 of FIG. 2.

Also provided external to the P-channel transistor 304 of FIG. 6 is switch circuitry 308 that may be controlled by other components (not shown). This switch circuitry 308, together with the two well ties 136, 196 of this second aspect of the present invention, allows a user of a CMOS programmable array that embodies the transistor 304 to choose either one or both of the well ties, depending on the ultimate circuit configuration. For example, if it is desired to provide the cold sparing feature of the first aspect of the present invention, then the switch circuitry 308 is operable to connect only the P+ well tie 196 to the positive voltage supply, Vdd. This would prevent any undesired current flow from the I/O pad 116 back to the positive voltage supply.

On the other hand, depending upon the ultimate circuit configuration of the P-channel transistor 304 of FIG. 6, it may be desirable to allow for the selection of only the N+ well tie 136 to be connected through the switch circuitry 308 to additional circuitry (not shown), such as a microprocessor or other control logic. This could be the situation when there is no danger to this other circuitry, connected to the switch circuitry 308 by the signal lines 312, from the current flowing through the forward biased P/N junction (comprising the P+ drain 192 and N− well 200) and out of the well 200 through the N+ well tie 136.

This second aspect of the present invention allows a programmable architecture for a CMOS gate array to be implemented. The P-channel transistor 304 of FIG. 6 is but one of many, identical such transistors implemented in the gate array. The switch circuitry 308, together with the circuitry (not shown) connected thereto by the signal lines 312, may also be implemented in the same substrate 164 as the P-channel transistor 304. The programmable architecture allows either the normal N− well ties 136 to be selected, or the cold sparing P+ well ties 196 to be selected. These ties are preferably formed in the same N− well 200. For example, in normal gate array operation, the N+ well ties 136 alone, or the N+ well ties 136 and the P+ well ties 196 together, may be selected. In contrast, for cold sparing operation, only the P+ well ties 196 are required to be contacted in the N− well 200 when isolation of the positive voltage power supply plane is desired. For a programmable gate array implementation, the switch circuitry 308 may merely comprise selectable fusible links.

The P-channel transistor internal structure of the first aspect of the present invention represents a significant reduction in the resulting implemented architecture, as compared to the prior art. For example, as compared to the scheme illustrated in FIG. 3b of the aforementioned prior art U.S. Pat. No. 5,117,129, the cold sparing P+ well tie of the present invention eliminates the need for the extra N− well and N-channel transistor of that patent. These components are replaced solely with the P+ well tie 196 of FIG. 3 herein. In addition, with this simplified structure, the charging of the N− well 200 is no longer dependent upon the N-channel transistor and N+ well tie of U.S. Pat. No. 5,117,129. Instead, the charging of the N− well 200 is a direct forward bias through the P+ well tie.

It is to be understood that the formation of the P-channel transistors 156, 304 of FIGS. 3 and 6 into an N− well 200, which is formed in a P− silicon substrate 164 is strictly exemplary. Instead, the substrate may comprise semiconductor material other than silicon, and doped other than P−. For example, the substrate may be doped or formed with an electrical conductivity of N−. As such, there is no need to utilize an N− well 200. Instead, the P-channel transistors may be formed directly into the N− substrate. However, this may also require the N-channel transistor 160 to be formed in a P− well, which itself is formed in the N− substrate.

Also, the doping or electrical conductivity types of the various transistor, well and substrate regions, described and illustrated herein, are strictly exemplary. Other electrical conductivity types may be utilized and should be apparent to one of ordinary skill in the art, in light of the teachings herein.

It should be understood by those skilled in the art that obvious structural modifications can be made, in light of the teachings herein, without departing from the scope of the invention. Accordingly, reference should be made primarily to the accompanying claims, rather than the foregoing specification, to determine the scope of the invention.

Having thus described the invention, what is claimed is:

1. A P-channel, metal oxide semiconductor field effect transistor, comprising:
   a substrate comprised of silicon semiconductor material having a P− electrical conductivity;
   a well region formed in the silicon semiconductor substrate, the well region having an N− electrical conductivity;
   a drain region formed in the well region, the drain region having a P+ electrical conductivity;
   a source region formed in the well region, the source region having a P+ electrical conductivity;
   a channel region formed in the well region, the channel region being located between the drain region and the source region;
   a gate terminal disposed above the well region formed in the silicon semiconductor substrate in proximity to the channel region, the gate terminal being separated from the channel region by an insulating region;
   a first well tie region formed in the well region, the first well tie region having a P+ electrical conductivity and being separate from the source region; and
   a second well tie region formed in the well region, the second well tie region having an N+ electrical conductivity, wherein the first well tie region and the second well tie region being connected to separate control lines of an external switching circuit.

2. The transistor of claim 1, further comprising switching means, connected to both the first well tie region and the second well tie region, for selectively connecting at least one of the first and second well tie regions with a corresponding at least one signal line.

3. A complimentary metal-oxide semiconductor (CMOS) transistor formed on a semiconductor substrate having a first conductivity type region and a second conductivity type region, comprising:
   a first metal-oxide semiconductor (MOS) transistor formed in the first conductivity type region, the first MOS transistor comprising a first source region, a first drain region, a first well tie region and a second well tie region, the first well tie region being separate from the first source region and having a conductivity type which is different from the first conductivity type region and the second well tie region being separate from both the first well tie region and the source region, the second well tie region having a conductivity type which is the same as the first conductivity type region, the first and the second well tie regions each being connected to separate control lines of an external switching circuit to charge the first conductivity type region; and
   a second MOS transistor formed in the second conductivity type region, the second MOS transistor comprising a second source region and a second drain region, the second MOS transistor further comprising a third well tie region having a conductivity type which is the same as the second conductivity type region.

4. The CMOS transistor of claim 3, further comprising a switching circuit connected to the first well tie region and the second well tie region, the switching circuit selectively connecting at least one of the first and second well tie regions with at least one signal line.

5. The CMOS transistor of claim 3, wherein the first conductivity type region is a doped n-well, the second conductivity type region is a p-type substrate and the first MOS transistor is a p-channel transistor formed in the doped n-well region of the p-type substrate.

6. The CMOS transistor of claim 3, wherein the first conductivity type region is a doped p-well, the second conductivity type region is a n-type substrate and the first MOS transistor is a n-channel transistor formed in the doped p-well region of the n-type substrate.

* * * * *